US010074681B2

(12) United States Patent
Cao et al.

(10) Patent No.: US 10,074,681 B2
(45) Date of Patent: Sep. 11, 2018

(54) LIGHT SHIELD FOR LIGHT SENSITIVE ELEMENTS

(71) Applicant: X-FAB SEMICONDUCTOR FOUNDRIES AG, Erfurt (DE)

(72) Inventors: Xuezhou Cao, Devon (GB); Daniel Gaebler, Apolda (DE)

(73) Assignee: X-FAB SEMICONDUCTOR FOUNDRIES AG, Erfurt (DE)

( * ) Notice: Subject to any disclaimer, the term of this patent is extended or adjusted under 35 U.S.C. 154(b) by 0 days.

(21) Appl. No.: 15/271,881

(22) Filed: Sep. 21, 2016

(65) Prior Publication Data

US 2017/0084654 A1 Mar. 23, 2017

(30) Foreign Application Priority Data

Sep. 22, 2015 (GB) .................................. 1516784.4

(51) Int. Cl.
*H01L 27/146* (2006.01)
*H04N 5/361* (2011.01)

(52) U.S. Cl.
CPC .. *H01L 27/14623* (2013.01); *H01L 27/14685* (2013.01); *H04N 5/361* (2013.01)

(58) Field of Classification Search
CPC ......... H01L 27/14623; H01L 27/14685; H01L 27/14818; H01L 27/3272; H01L 31/0232; H01L 31/02162; H01L 31/02164; H01L 23/5225; H01L 29/78633; H01N 5/361
See application file for complete search history.

(56) References Cited

U.S. PATENT DOCUMENTS

| 6,278,169 | B1 | 8/2001 | Sayuk et al. | |
|---|---|---|---|---|
| 6,812,539 | B1 | 11/2004 | Rhodes | |
| 7,205,623 | B2 | 4/2007 | Hong et al. | |
| 7,385,270 | B2* | 6/2008 | Ihara | H01L 27/14623 257/291 |
| 7,390,690 | B2 | 6/2008 | Rhodes | |
| 7,633,106 | B2 | 12/2009 | Adkisson et al. | |
| 7,851,879 | B2* | 12/2010 | Inoue | H01L 27/14623 257/414 |
| 8,094,225 | B2* | 1/2012 | Yamashita | H04N 5/3595 257/291 |

(Continued)

FOREIGN PATENT DOCUMENTS

WO WO 2013/122015 8/2013

OTHER PUBLICATIONS

Examination Report for GB 1516784.4, dated Jun. 23, 2016, 1 page.
Search Report for GB 1516784.4, dated Oct. 20, 2015, 4 pages.

*Primary Examiner* — Cheung Lee
*Assistant Examiner* — Stephen C Smith
(74) *Attorney, Agent, or Firm* — Nixon & Vanderye PC

(57) ABSTRACT

A light shield for shielding a light sensitive element in an image sensor comprising a primary plate located such as to shield the light sensitive element from incident light, the primary plate comprising at least one aperture and the or each aperture being associated with a light blocking structure, wherein the light blocking structure comprises a secondary plate and a wall; the wall is arranged between the primary plate and the secondary plate, and is configured to act as a light barrier to light passing between the primary plate and the secondary plate.

13 Claims, 18 Drawing Sheets

(56) References Cited

U.S. PATENT DOCUMENTS

| | | | |
|---|---|---|---|
| 2001/0052636 A1* | 12/2001 | Wada | H01L 31/02164 |
| | | | 257/630 |
| 2008/0099867 A1 | 5/2008 | Sato et al. | |
| 2008/0105908 A1* | 5/2008 | Lee | H01L 27/14623 |
| | | | 257/290 |
| 2009/0189236 A1* | 7/2009 | Hayashi | H01L 27/14623 |
| | | | 257/432 |
| 2010/0110096 A1* | 5/2010 | Satoh | G01J 1/4204 |
| | | | 345/589 |
| 2011/0303956 A1 | 12/2011 | Cheon et al. | |
| 2012/0199930 A1 | 8/2012 | Hayashi | |
| 2012/0230669 A1* | 9/2012 | Abe | H01L 27/14618 |
| | | | 396/439 |
| 2012/0280107 A1 | 11/2012 | Skurnik et al. | |
| 2014/0203391 A1* | 7/2014 | Daamen | H01L 31/02164 |
| | | | 257/443 |

\* cited by examiner

LIGHT SHIELD FOR LIGHT SENSITIVE ELEMENTS

This application claims priority to GB Patent Application No. 1516784.4 filed 22 Sep. 2015, the entire contents of which is hereby incorporated by reference.

TECHNICAL FIELD

The present invention relates to light shields for light sensitive elements.

BACKGROUND

Even when there is no incident light, optical sensors usually have a background current (also referred to as the "dark current"), due to thermal effects. In order to accurately measure light incident on pixel sensors, it is necessary to know this dark current. A common solution to this problem is to include diodes or pixels in the optical sensor which are not exposed to light, to act as reference diodes/pixels to enable the determination of this dark current. These diodes/pixels are referred to as "dark diodes" or "dark pixels". The correct light level in the detecting sensors can then be determined by subtracting the dark current from the current generated by light receiving sensors.

A typical arrangement for dark pixels is to have a light shield covering a subset of the pixels in a light sensor array. A typical arrangement is shown in FIG. 1, which shows a sensor array (101), with row (102) and column (103) control logic, and a metal plate (104) placed over a section of the sensors so as to shield the dark pixels. The dark current can then be determined.

A problem which may occur with such an arrangement however is that stresses tend to develop in any large piece of metal, which may result in deformation and consequent problems such as delamination. It is common practice for such metal shields to have slots inserted to allow relief of these stresses. CMOS design rules for example require such slots at fixed intervals. Clearly, slots or openings in a light shield will cause problems in that the light shield will no longer fulfil its function.

The problem is addressed in U.S. Pat. No. 6,278,169, in which a second metal layer is placed beneath the light shield. This second layer also has slots, which are located such that they are staggered with respect to the slots in the upper layer. This arrangement is illustrated in FIG. 2, which shows upper layer (201) and lower layer (202) with respective slots (203, 204). However light can still be reflected between the layers (205) and hence reach the light sensors below, rendering the dark diode or pixels not truly dark. In U.S. Pat. No. 6,278,169 this problem is addressed by the use of an antireflective coating (206) applied to the metal layers.

However, the present inventors have appreciated that this solution is not completely effective against light penetration to the sensors and additionally is complex to manufacture and adds cost to the production of the sensor devices.

SUMMARY OF THE INVENTION

The present invention seeks a solution to the problems outlined above concerning unwanted incident light on dark pixels caused by stress relieving slots in a light shield. It is an object of certain embodiments to provide a simple and cost effective light shield for a light sensitive element, preferably using an existing technology with minimal adaptation to implement it.

Accordingly, in a first aspect of the present invention, there is provided a light shield for shielding a light sensitive element in an image sensor comprising a primary plate located such as to shield the light sensitive element from incident light, the primary plate comprising at least one aperture and the or each aperture being associated with a light blocking structure, wherein the light blocking structure comprises a secondary plate and a wall. The wall is arranged between the primary plate and the secondary plate, and is configured to act as a light barrier to light passing between the primary plate and the secondary plate. This helps to prevent unwanted light from reaching the dark pixels of a light sensitive element.

At least one of the primary and the secondary plates may comprise metal. This may enable existing manufacturing processes to be re-used.

The wall may extend from one of the primary plate and the secondary plate toward the other of the primary plate and the secondary plate. This may help with attaining maximum optical isolation of the dark pixels.

The wall may at least partially be constructed using a via process. This may enable existing technology to be re-used.

The wall may comprise tungsten. This may allow existing via processes to be used.

In certain embodiments, the associated light blocking structure is configured to block substantially all light passing through the or each aperture.

Optionally the light shield comprises a plurality of apertures, wherein the secondary plate forms part of the light blocking structure of each of the plurality of apertures.

Optionally the light shield comprises a plurality of apertures and a plurality of secondary plates, wherein each aperture is associated with a separate secondary plate.

In a second aspect of the present invention there is provided a light sensitive element comprising a light shield according to the first aspect.

Optionally the light sensitive element comprises a first plurality of light sensitive elements and a second plurality of light sensitive elements, the light shield being located and shaped such that it covers the first plurality of light sensitive elements, but not the second plurality of light sensitive elements, the image sensor being configured such that, in use, the second plurality of light sensitive elements detects incident light and the first plurality can be used to determine a dark current in the light sensitive elements.

In a third aspect of the invention, there is provided an image sensor comprising a light shield according to the first aspect, or a light sensitive element according to the second aspect.

DETAILED DESCRIPTION

Embodiments will now be described more fully hereinafter with reference to the accompanying drawings, in which certain embodiments are shown. However, other embodiments in many different forms are possible within the scope of the present disclosure. Rather, the following embodiments are provided by way of example so that this disclosure will be thorough and complete, and will fully convey the scope of the disclosure to those skilled in the art.

Figure 1:
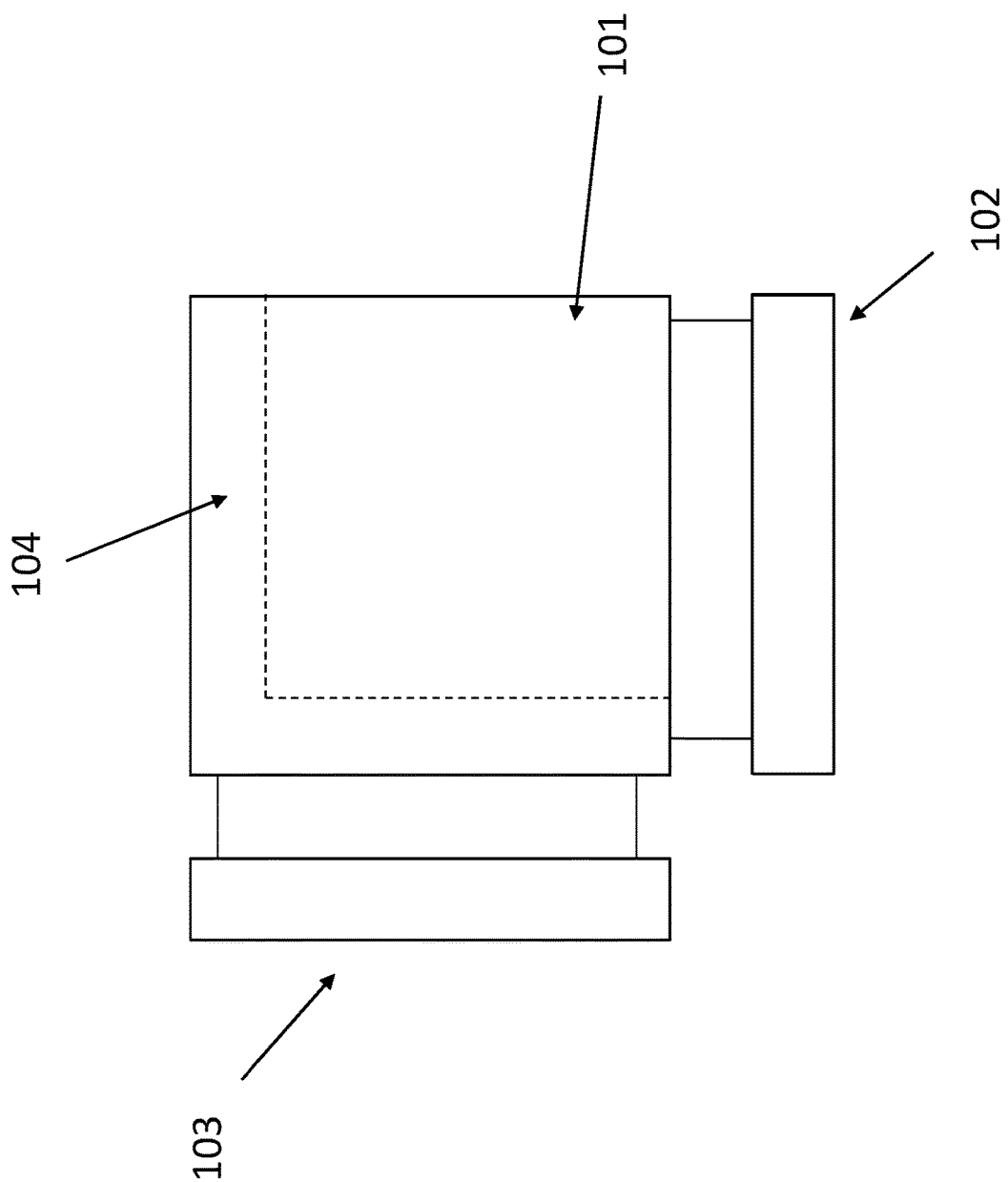
FIG. 1 is a plan view of a light shield covering an array of pixels according to the prior art.
Figure 2:
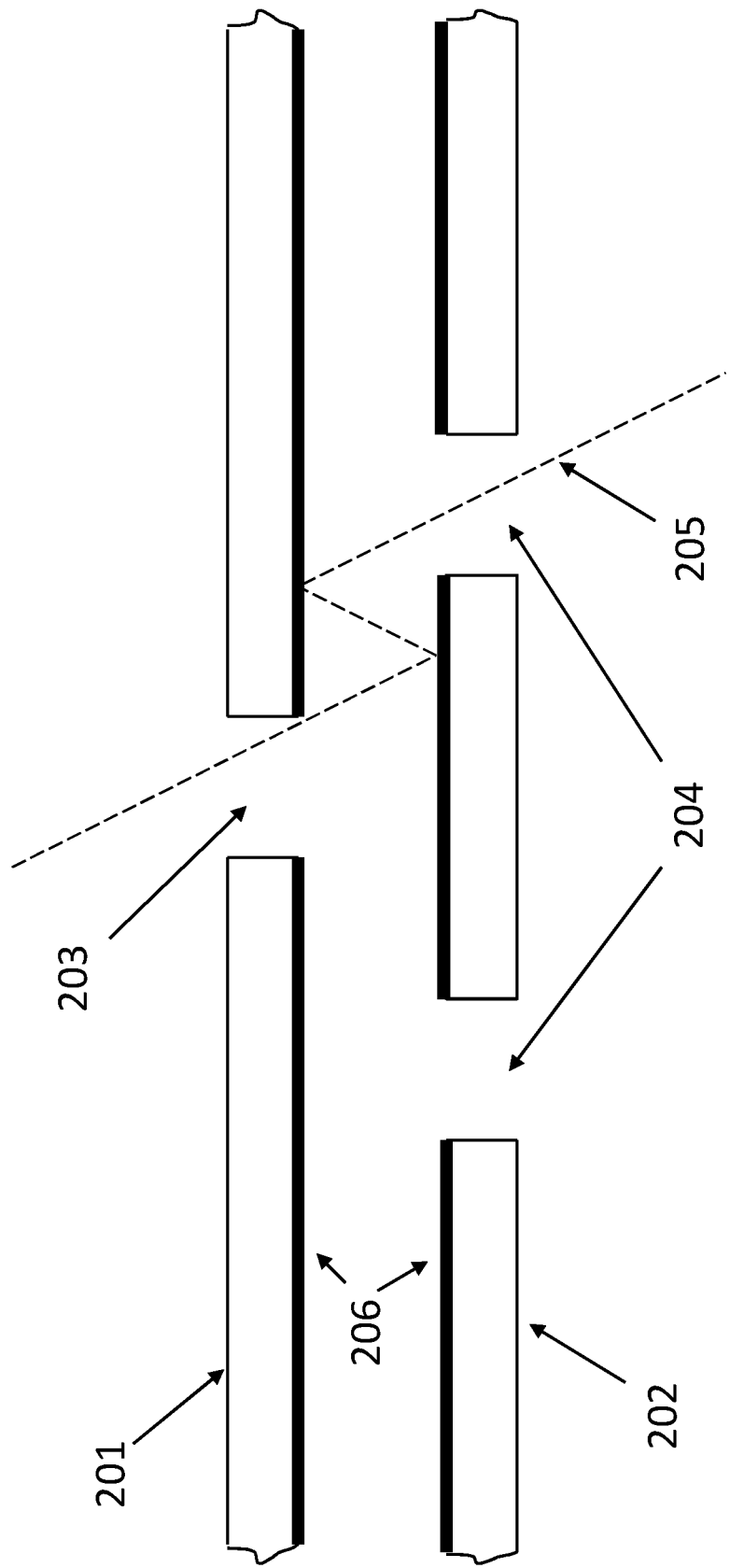
FIG. 2 is a cross sectional view of a two layer light shield according to the prior art.
Figure 3:
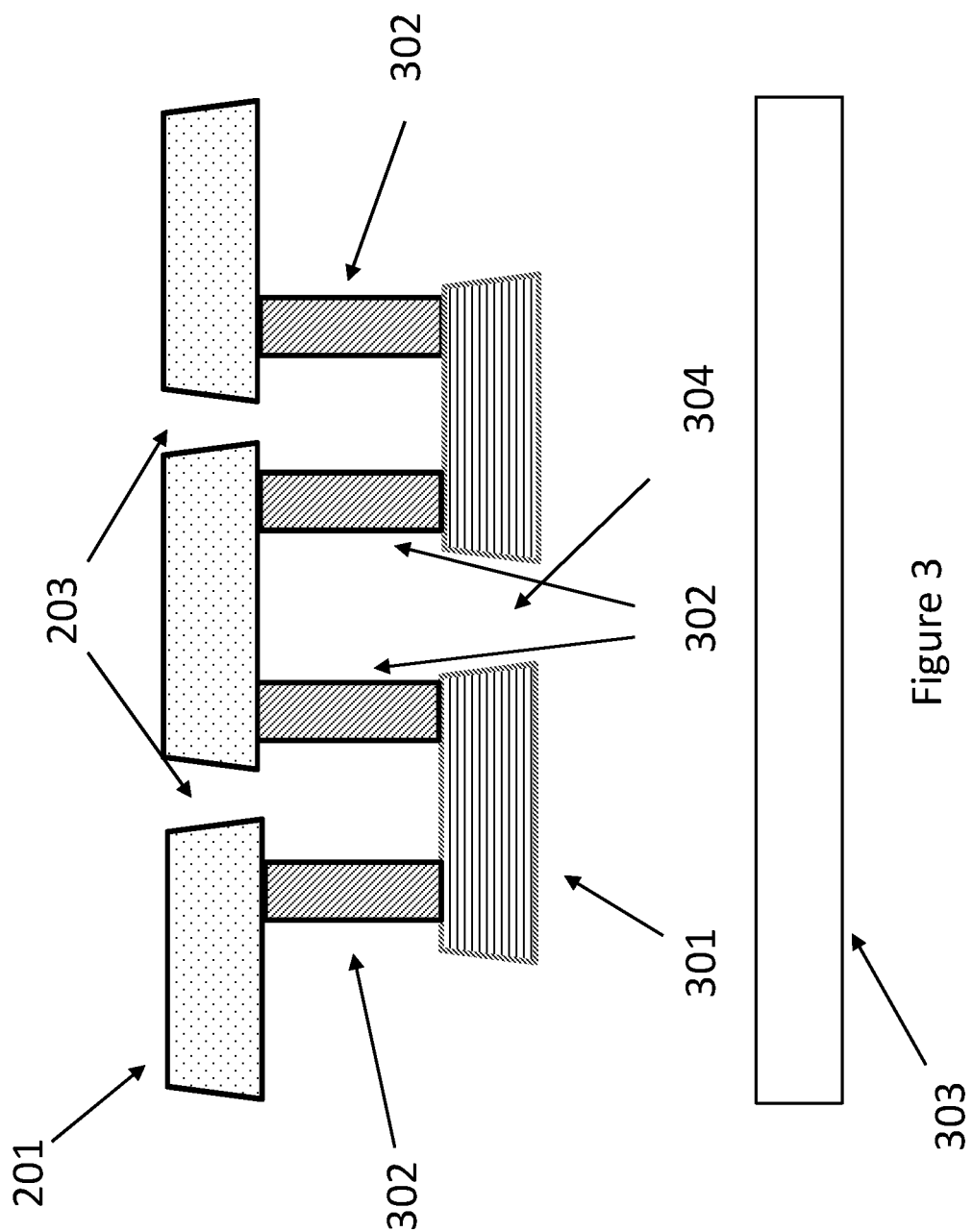
FIG. 3 is a cross sectional view of a two layer light shield with light blocking wall according to an embodiment of the present invention.
Figure 4:
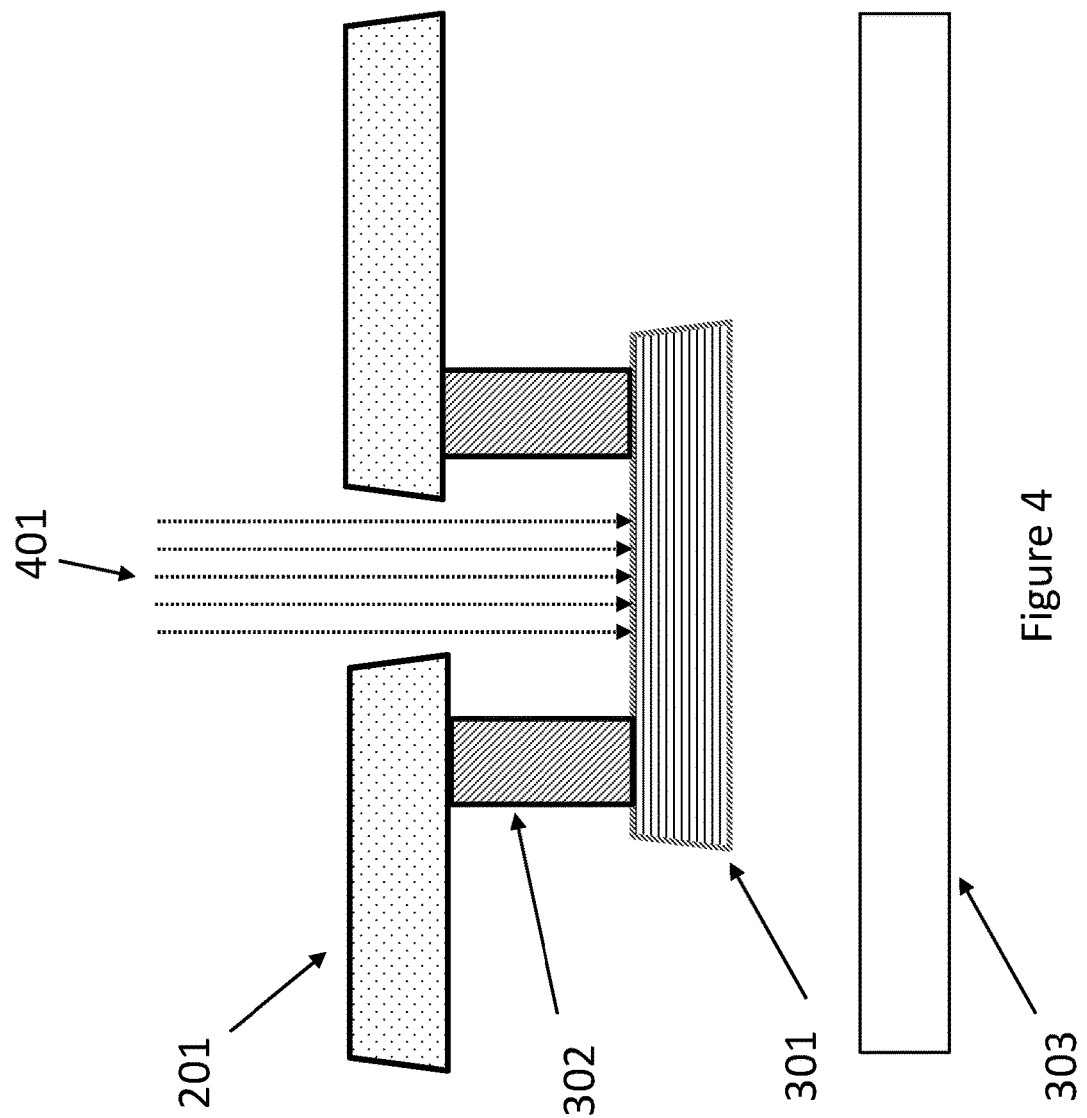
FIG. 4 is a cross sectional view of the two layer light shield of FIG. 3, showing the blocking of normally incident light.
Figure 5:
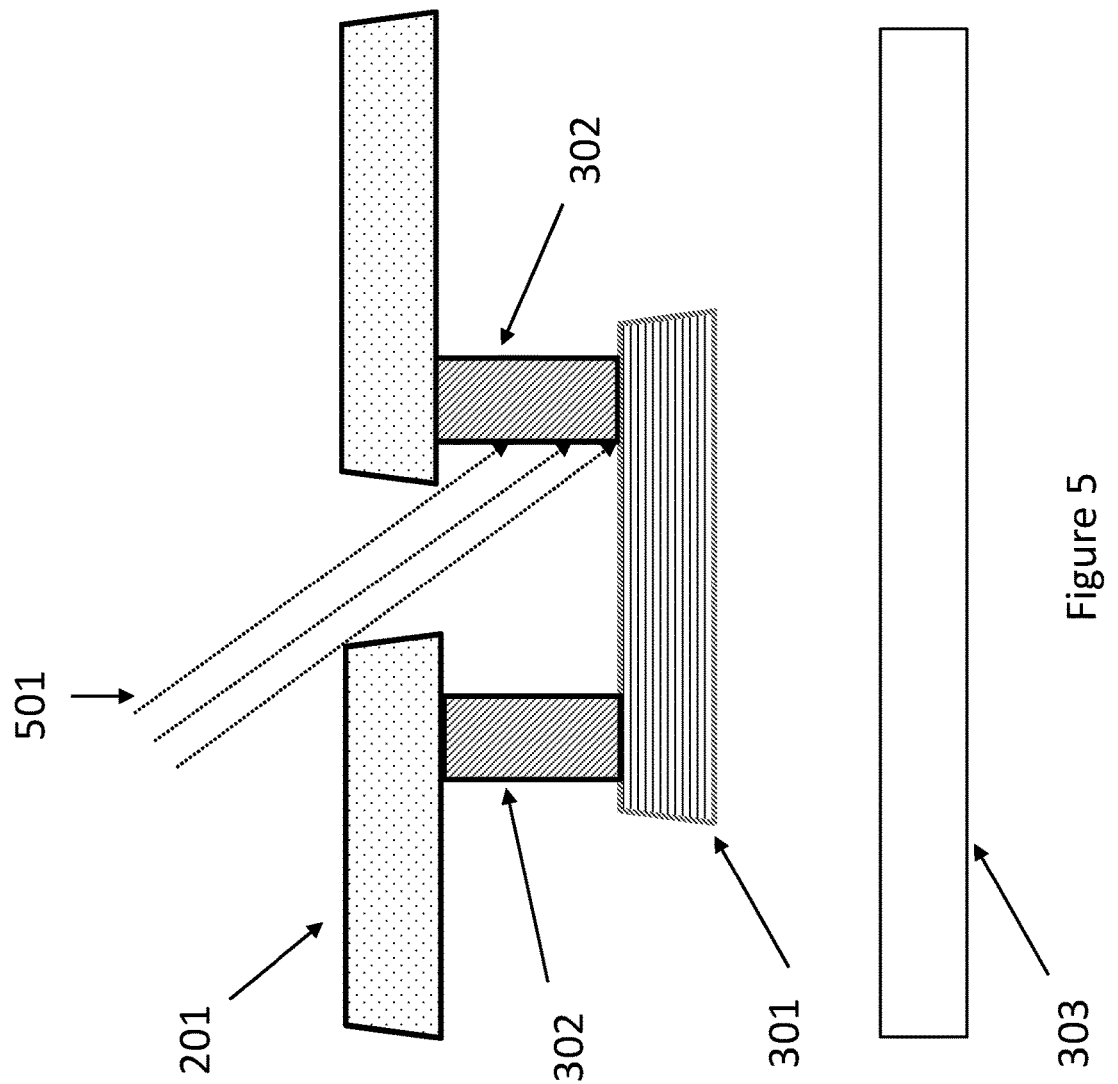
FIG. 5 is a cross sectional view of a two layer light shield of FIG. 3, showing the blocking of non-normally incident light.

FIG. 3 is a cross sectional view of a light shield according to an embodiment of the present invention. The light shield comprises a primary plate (201) with a plurality of slots (203). Each slot (203) in primary plate (201) is provided with a corresponding secondary plate (301) positioned opposite the slot, with walls (302) extending from the primary plate (201) substantially towards the secondary plate (301). The primary and secondary plates extend generally parallel to each other. This arrangement allows the blocking of access of incident light to the pixel sensors (303) below. FIG. 4 illustrates the blocking of normally incident light (401) by the secondary plate (301) and FIG. 5 illustrates the blocking of non-normally incident light (501) by the walls (302). In the embodiment of the present invention shown, the walls extend substantially continuously around the perimeter of the slots and thus provide a substantially complete barrier to any light passing into the slots. However, the person skilled in the art will appreciate that modifications may be made to the arrangement such that the walls do not extend completely between the primary plate (201) and the secondary plate (301), so long as light incident on the slot is prevented from passing to the sensor array (303).

The physical barrier provided by this embodiment is made possible by the recognition that such an arrangement is not incompatible with the need to provide stress relieving slots. The realisation that the arrangement of FIG. 3, despite being formed with a continuous wall around the perimeter of the slots which connects the primary and secondary plates, allows sufficient stress relief, enables the use of a barrier located between the primary plate and the secondary plate. This avoids the need for complexly manufactured arrangements such as that of U.S. Pat. No. 6,278,169 with its completely independent plates and subsequent need for antireflective coatings.

Figure 6:
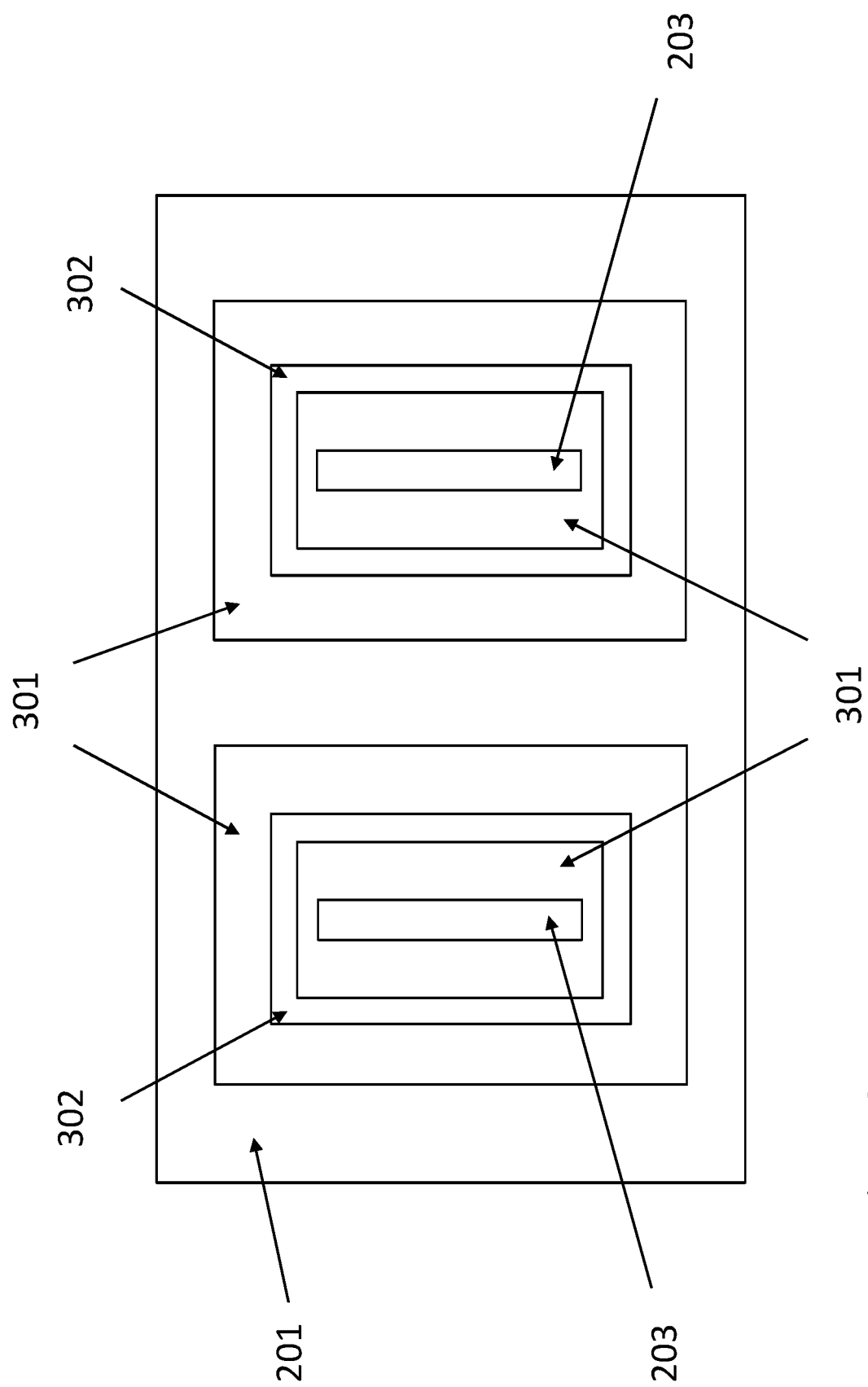
FIG. 6 is a partially cut-away top down view of the light shield of FIG. 3.

FIG. 6 is a partially cut-away top down view of the light shield of FIG. 3. The primary plate (201) is illustrated partially cut-away around the slot (203) in order to show the underlying arrangement, with the secondary plate (301) and the walls (302) now visible from above. Only the slot (203) would be visible from above in actual use.

The process of construction of the light blocking walls may be by means of a well-established technology. In an embodiment of the present invention, the technology used for the construction of vias in integrated circuits is used. A via is an electrical connection between layers in an integrated circuit that goes through the plane of one or more adjacent layers. Normally used for constructing a connection between layers in an integrated circuit, it has been recognised in this invention that this technology finds an alternative use in the construction of light blocking walls in a light shield. This enables a considerable simplification of construction of such light shields.

Figure 7:
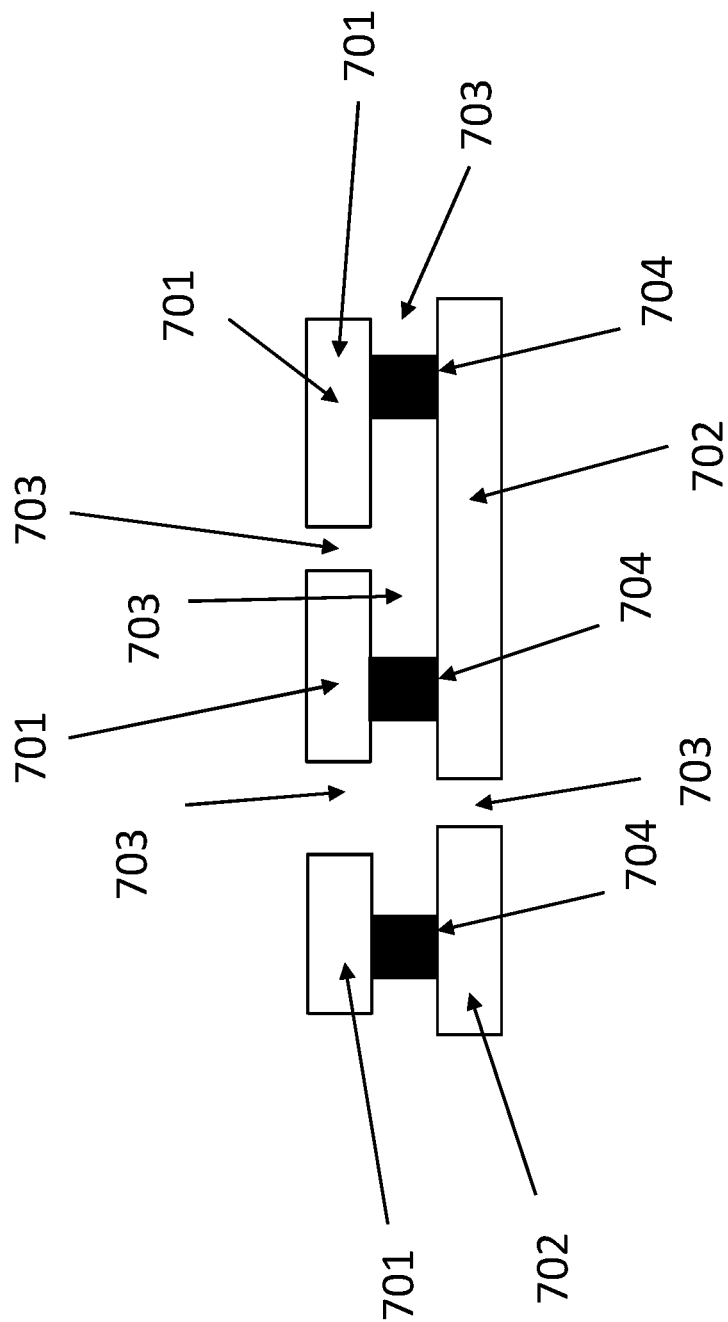
FIG. 7 is a cross sectional view of vias in an integrated circuit.

FIG. 7 is a cross-sectional view of an integrated circuit, IC, illustrating a typical prior art use of vias. The IC comprises a plurality of metal layers (701, 702), a dielectric (703) between the layers, and vias (704), each via being an individual pillar.

Figure 8:
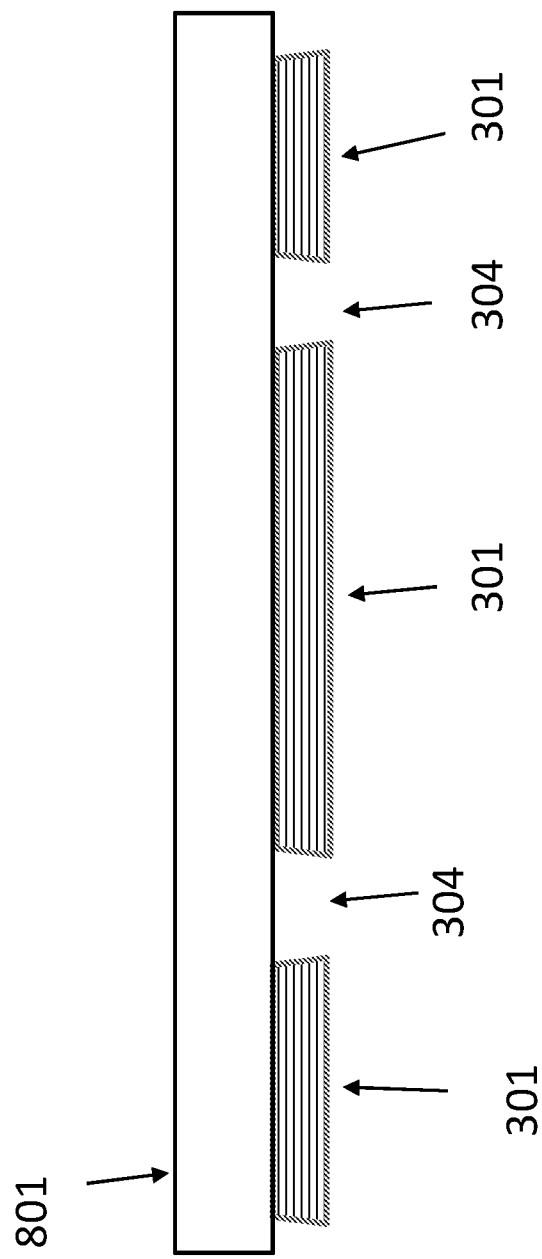
FIG. 8 is a cross sectional view of a light shield according to an embodiment of the present invention after a first stage of construction.
Figure 9:
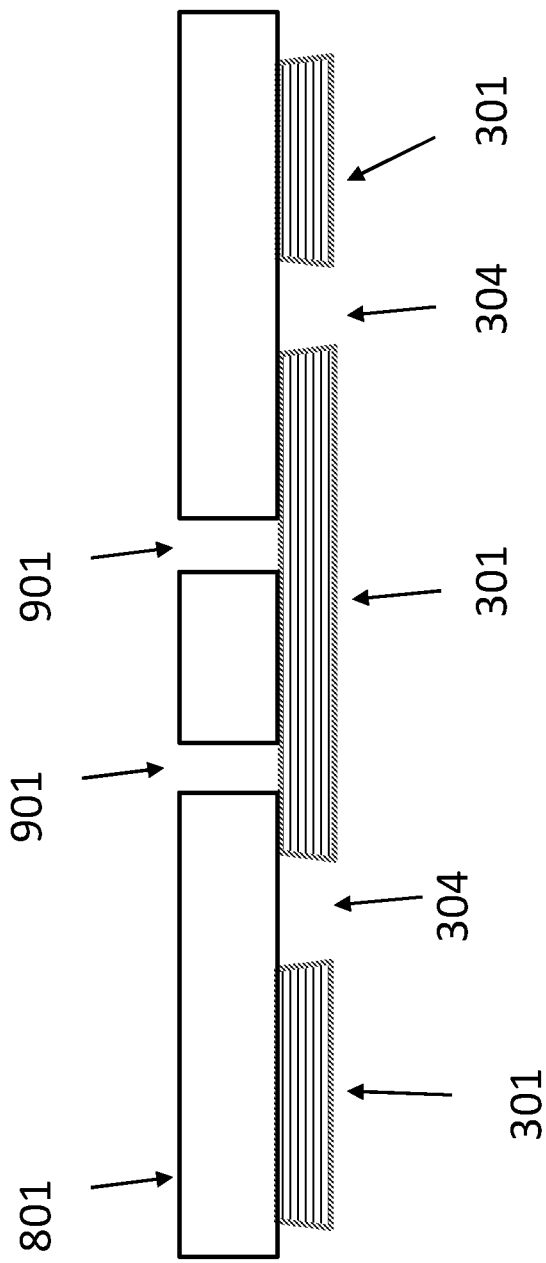
FIG. 9 is a cross sectional view of a light shield according to an embodiment of the present invention after a second stage of construction.

The process for constructing a wall using the via process according to an embodiment of the present invention is illustrated in FIGS. 8-12. FIG. 8 is a cross-sectional view of a light shield in the process of being constructed. The secondary plate (301) has been formed and a transparent isolation layer (801), typically made of glass or other dielectric, has been put in place over it. The primary plate has yet to be put in place. The first step of constructing the via walls comprises the etching of via holes into the dielectric isolation layer. FIG. 9 is a cross section of the partially constructed light shield of FIG. 8, after this first stage, with the via holes (901) etched through the dielectric layer (801).

Figure 10:
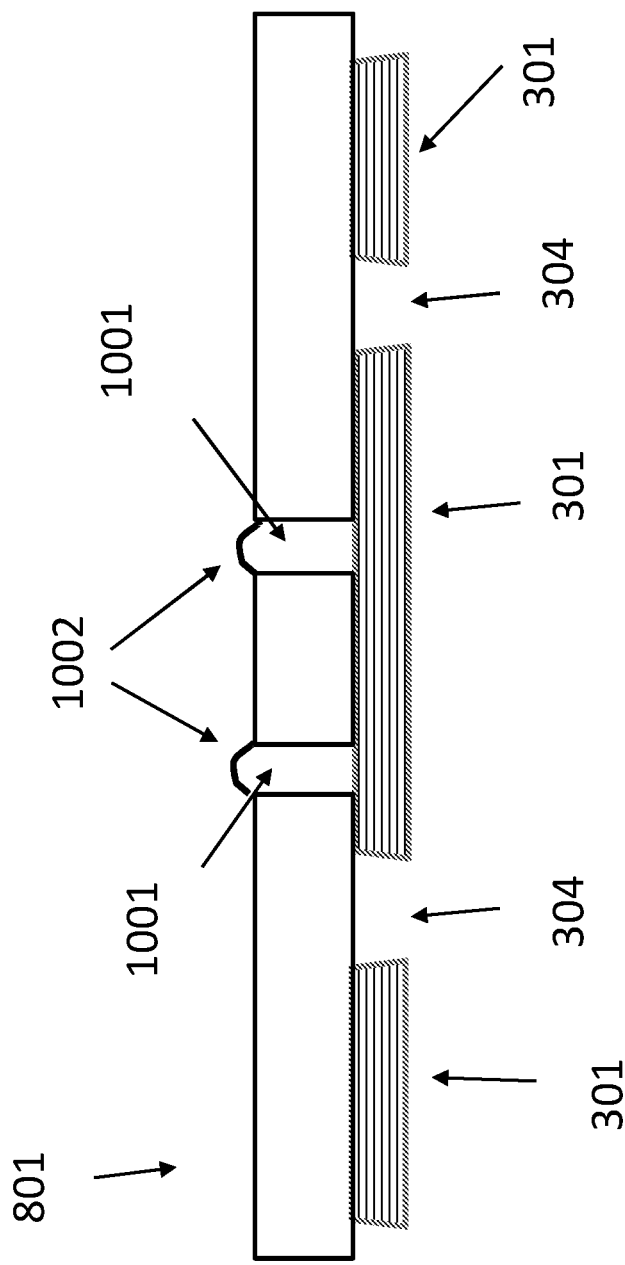
FIG. 10 is a cross sectional view of a light shield according to an embodiment of the present invention after a third stage of construction.
Figure 11:
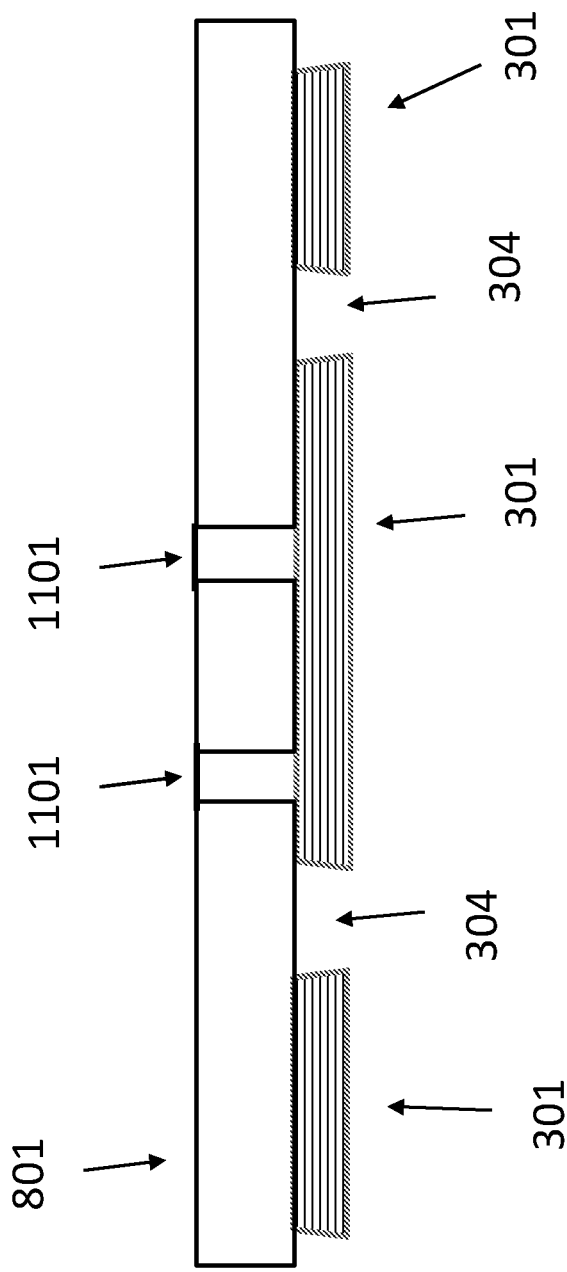
FIG. 11 is a cross sectional view of a light shield according to an embodiment of the present invention after a fourth stage of construction.

The next step is to fill the via holes with a metal. Typically the metal is tungsten, but the person skilled in the art will realise that tungsten is not the only option and the invention is not limited to any one metal. The holes are typically overfilled. FIG. 10 is a cross section of a light shield after the overfilling of the via holes. The overfill (1002) of the inserted metal (1001) rises above the surface of the dielectric layer (801). The overfill is then removed by polishing of the isolation layer. FIG. 11 is a cross sectional view of the result of this process, showing the completed vias (1101), smoothed to the level of the upper surface of the isolation layer (801).

Figure 12:
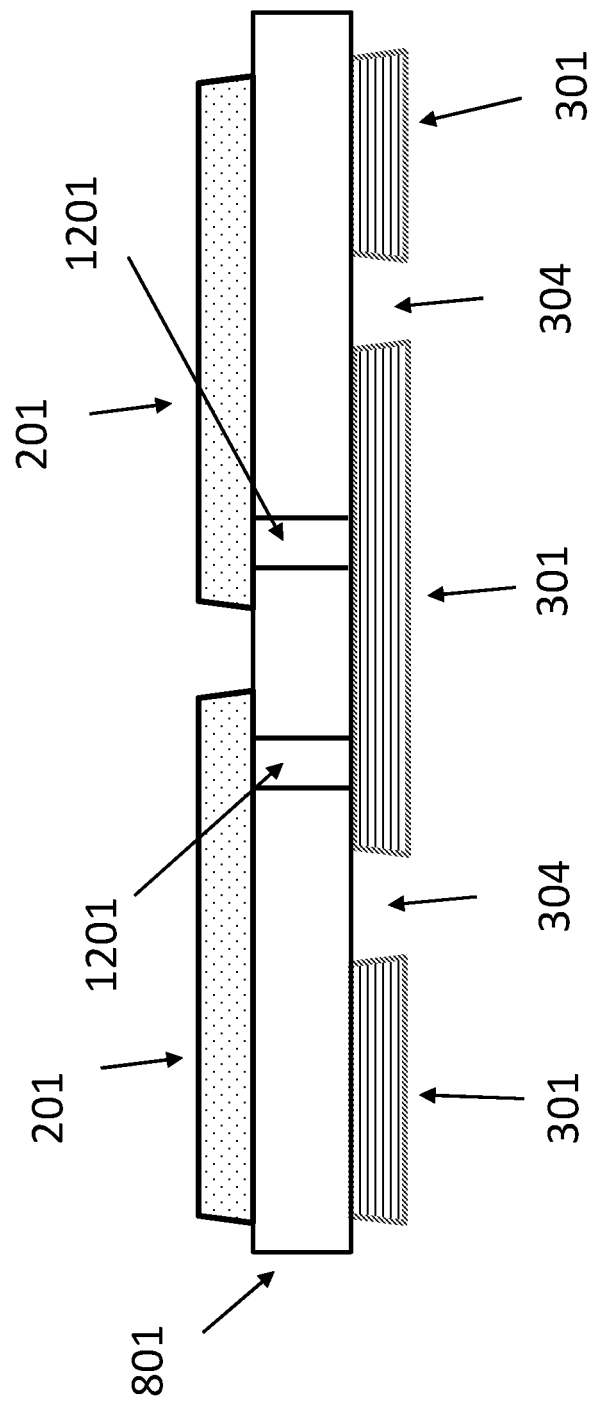
FIG. 12 is a cross sectional view of a light shield according to an embodiment of the present invention after a fifth stage of construction.

The primary plate is then added. FIG. 12 is a cross sectional view of the resulting light shield, with the primary metal plate (201) now added. The via walls (1201) now act as a light barrier.

Figure 13:
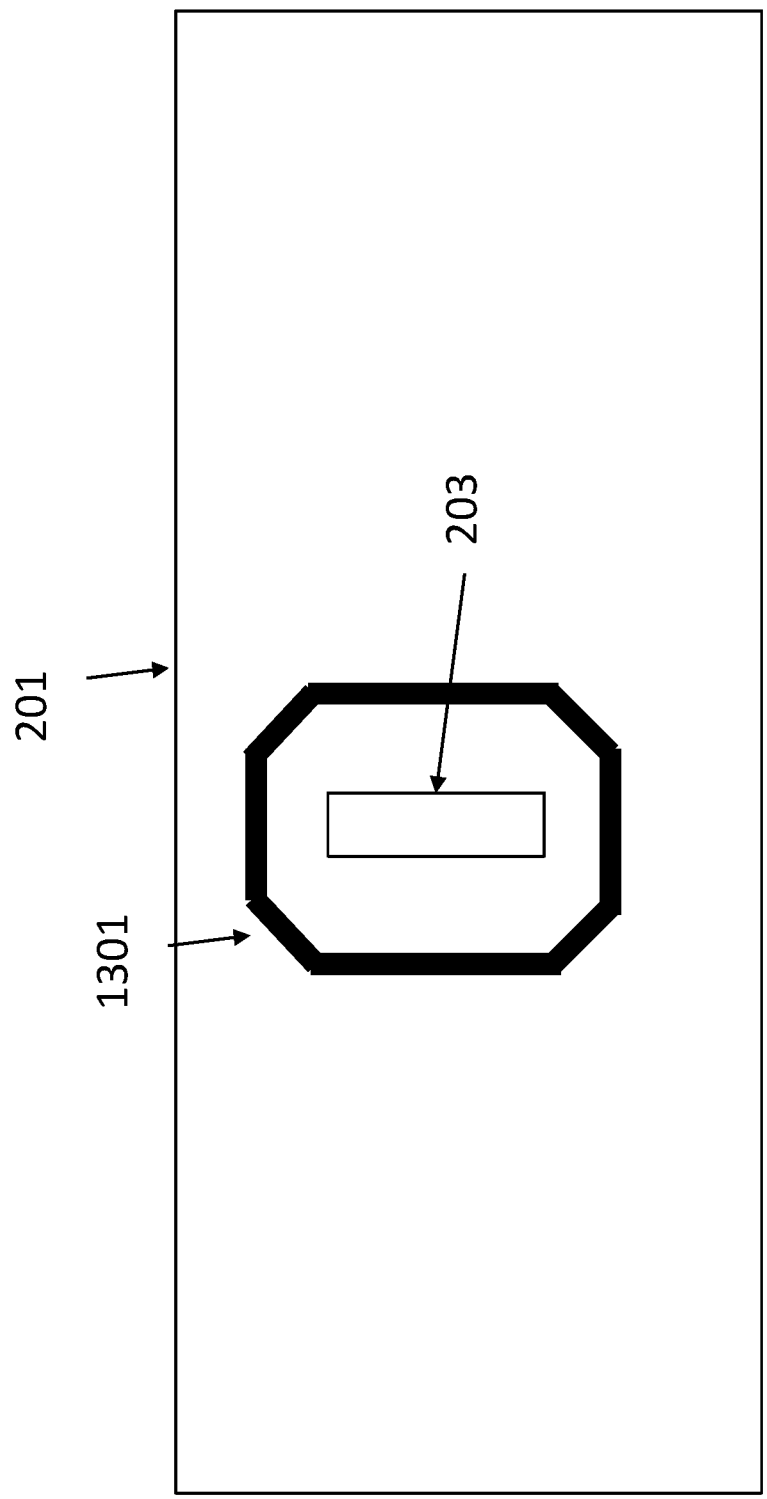
FIG. 13 is a top down view of a light shield with a via according to an embodiment of the present invention.

As discussed above, the conventional use of vias in integrated circuits is to provide an electrical connection between layers. For this purpose, a circular via is conventionally used. For the purpose of providing a light shield wall, however, this conventional shape may be inconvenient and conventional vias may be too small. The process is therefore adapted, according to embodiments of the invention, so that the via wall completely surrounds a stress relief slot in the upper shield layer. From the point of view of acting as a light shield wall, the shape of the via wall is immaterial, so long as it surrounds the slot and blocks light passing through it. The shape may for example be substantially rectangular, like the shield wall in FIG. 4 and FIG. 6. However, the via process may be easier to implement and hence costs may be reduced if the angle at which the wall (302) turns is less than 90°. In an embodiment of the invention, an octagonal wall is provided, as illustrated in FIG. 13. FIG. 13 is a partially cut-away view from below the light shield, with the secondary plate removed. This illustrates the shape and position of the octagonal wall (1301) relative to the slot (203) in this arrangement. In other embodiments, the shape of the wall may be any polygon, a circle, oval or even of irregular shape. The person skilled in the art will recognise that the shape of the wall does not significantly affect operation of the light shield and that the shape may be optimised for the manufacture process of the via walls. The invention is not limited to any one shape of wall. The wall may be constructed as a continuous via which surrounds the perimeter of an aperture. All portions of the wall may be constructed simultaneously. Alternatively the wall may be constructed by means of a plurality of adjacent vias positioned so as to surround an aperture. In such a construction the portions constituting the wall may be constructed sequentially.

Figure 14:
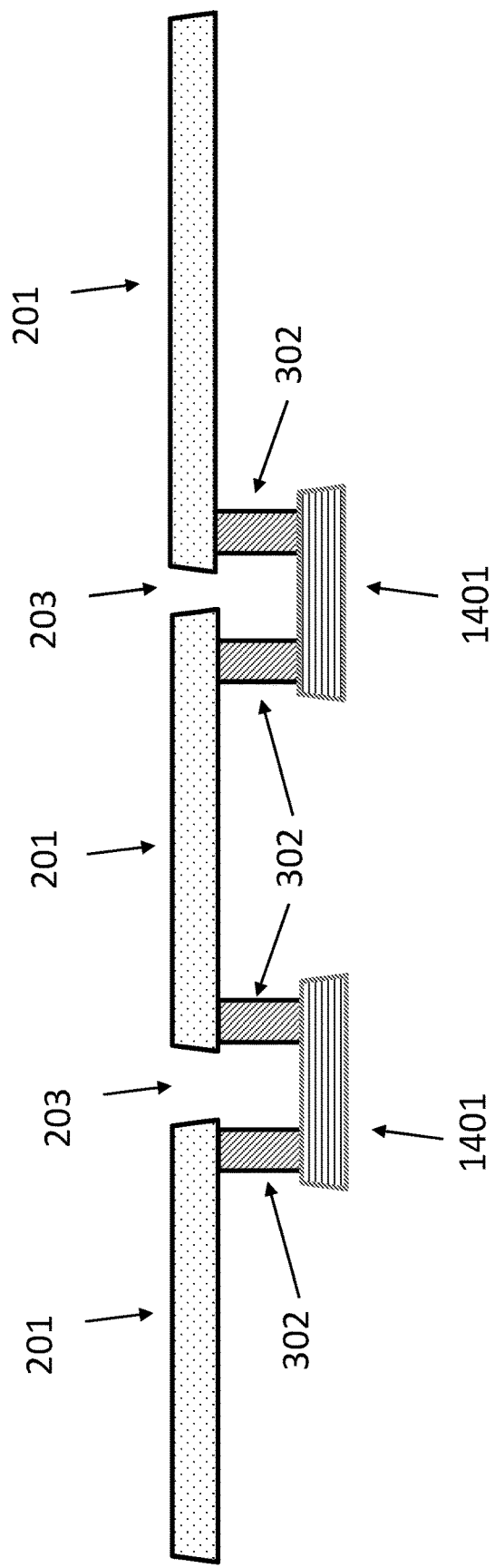
FIG. 14 is a cross sectional view of a light shield according to an embodiment of the present invention.
Figure 15:
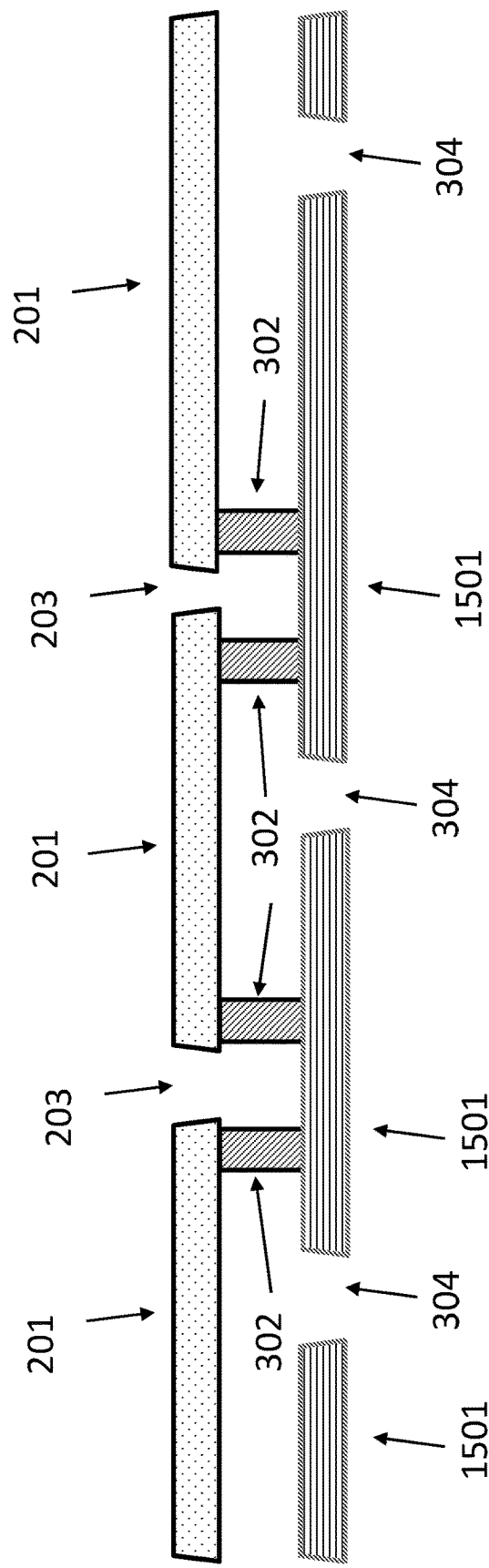
FIG. 15 is a cross sectional view of a light shield according to another embodiment of the present invention.
Figure 16:
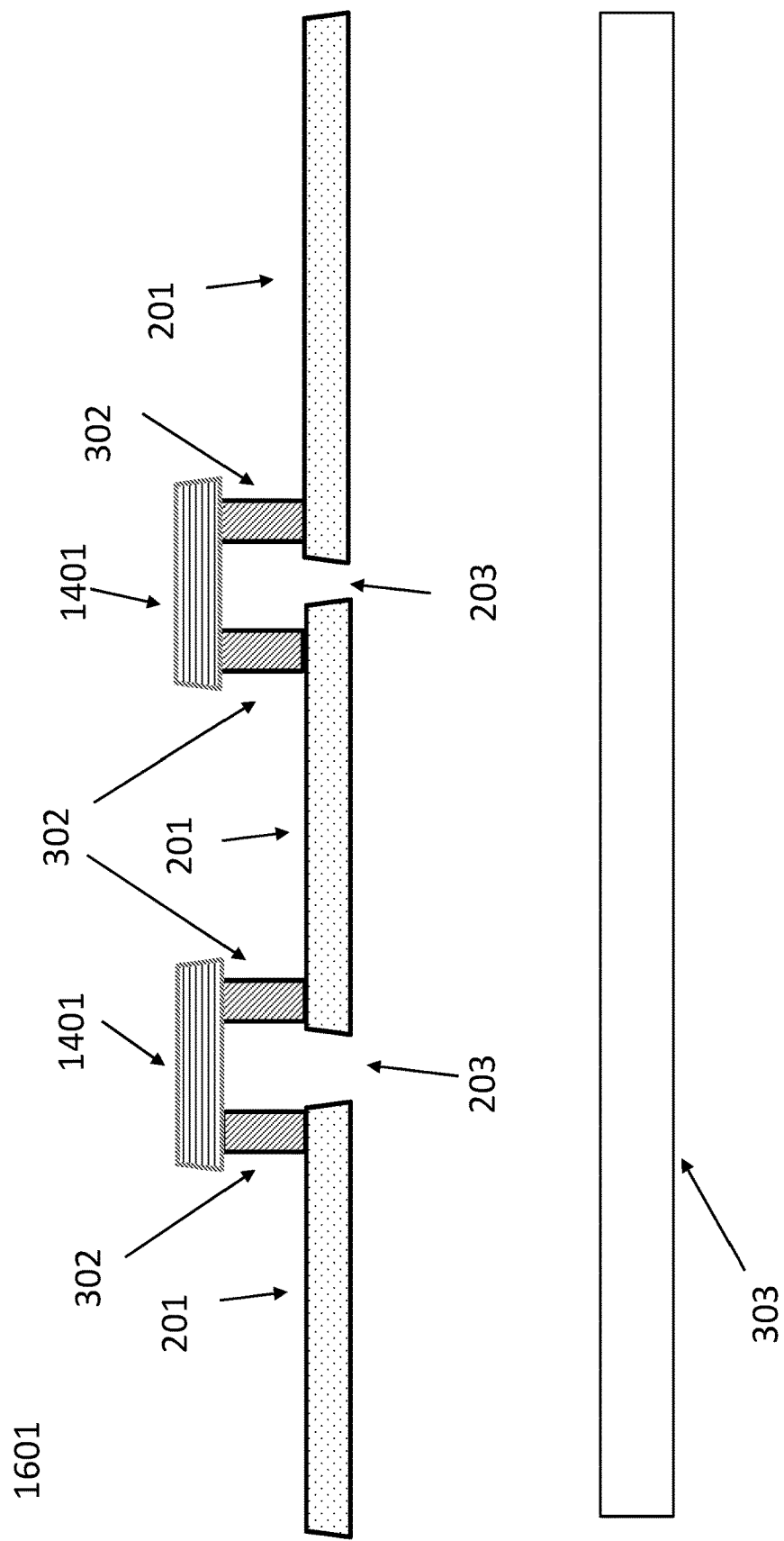
FIG. 16 is a cross sectional view of a light shield according to yet another embodiment of the present invention.
Figure 17:
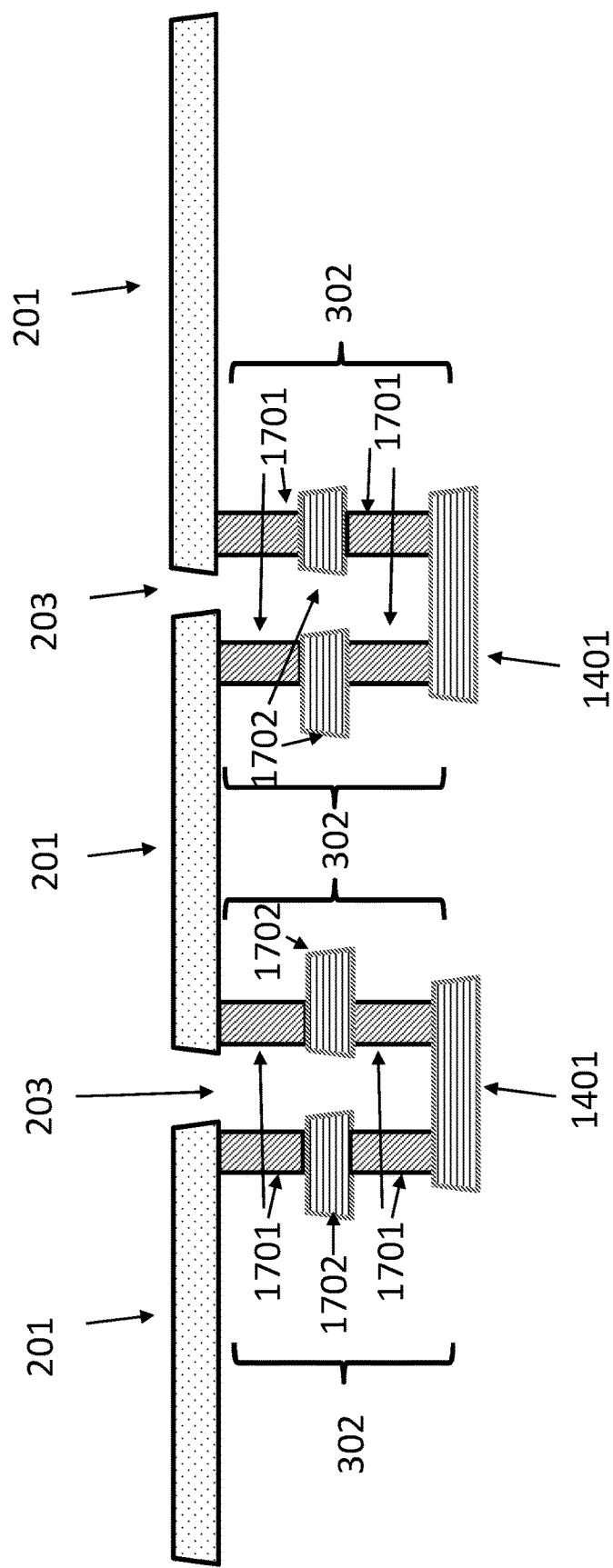
FIG. 17 is a cross sectional view of a light shield according to yet another embodiment of the present invention.
Figure 18:
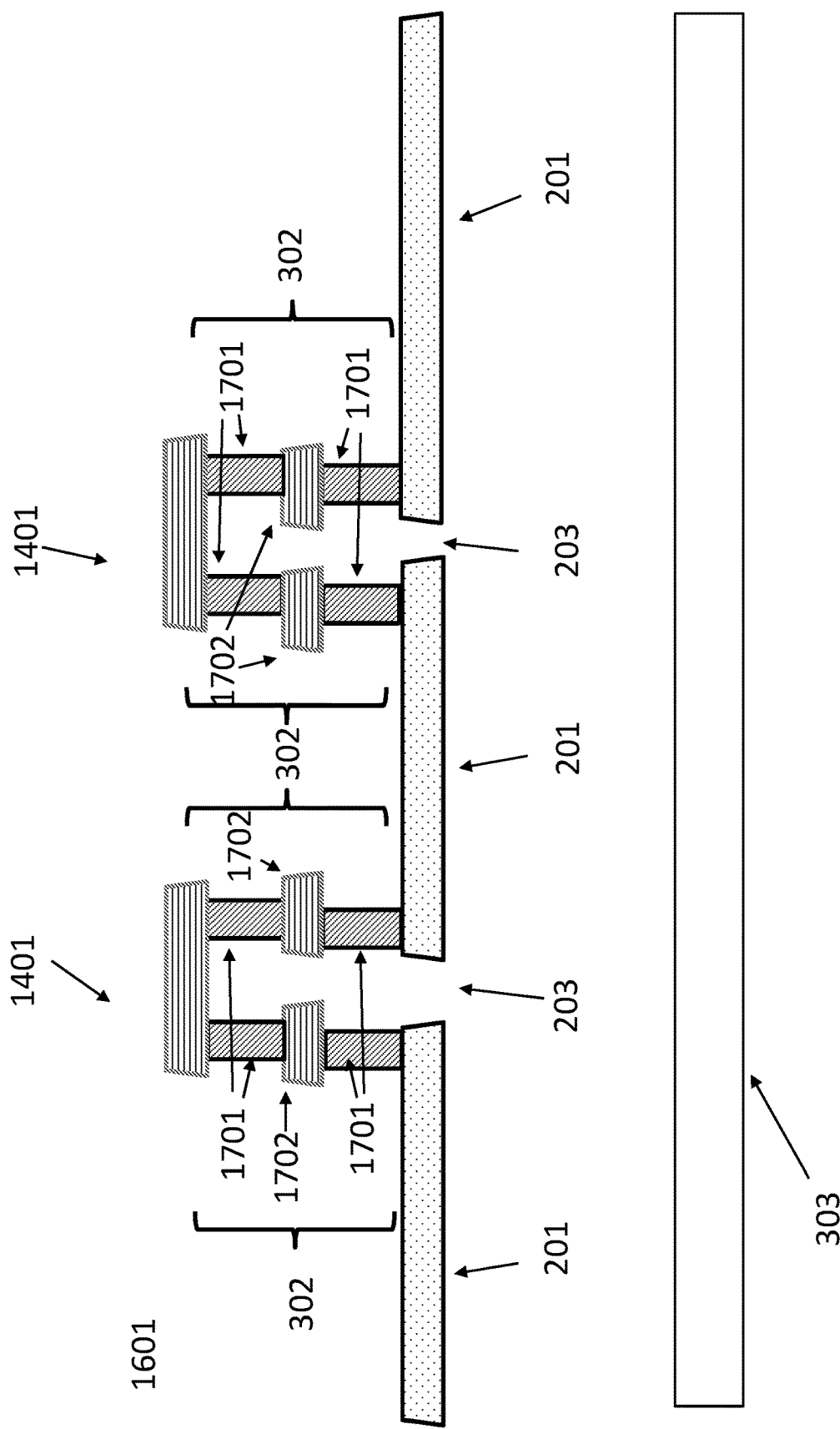
FIG. 18 is a cross sectional view of a light shield according to yet another embodiment of the present invention.

A number of alternative arrangements are possible for the secondary plates. In an embodiment, each of the slots in the primary plate has its own secondary plate. FIG. 14 is a cross-sectional view of a light shield according to this embodiment, illustrating the separate secondary plates (1401) associated with each of the slots (203) in the primary layer. FIG. 15 is a cross-sectional view of an alternative embodiment, in which there is a single, substantially continuous secondary plate (1501), which comprises slots (304) for stress relief in the same manner as the primary plate. FIG. 16 is a cross-sectional view of an embodiment of the invention in which the secondary plate(s) is/are located on a side (1601) of the primary plate (201) opposite to the light sensitive element (303). In this embodiment, it is again possible to provide a single, continuous secondary plate which forms part of the light blocking structure of a plurality of slots in the primary plate (as in FIG. 15), or a plurality of individual secondary plates for each slot in the primary plate (as in FIG. 14). The structure of FIG. 16 may be covered by dielectric material to protect the somewhat delicate light blocking structure (302, 1401), which stands proud of the primary plate (201). In further embodiments, the metal plates may not be adjacent and may have one or more extra metal plates between them. FIG. 17 is a cross sectional view of this type of arrangement in combination with the embodiment of FIG. 14. Each wall (302) now comprises two via sections (1701) and an intermediate plate (1702). FIG. 18 is a cross sectional view of this type of arrangement in combination with the embodiment of FIG. 16. This arrangement, with the wall comprising two vias and an intermediate plate may be applied to any of the embodiments described above. In further embodiments, more than one intermediate plate may be used. Further, the extent of the intermediate plate(s) may be relatively limited, e.g. limited to the area in which the vias are formed, or may approach, equal or exceed the dimensions of the primary and/or secondary plates.

In use, a light shield as described in the embodiments above may typically be used for a light sensor array, such as those used in digital cameras. The light shield offers protection from incident light for the "dark pixels", ensuring that current received from them is purely the result of the "dark current" caused by thermal effects. This allows the correct determination of the incident light on the light receiving sensors, by the subtraction of the dark current from their generated current, or other processing. The skilled person will recognise however that a light shield according to the invention may be used in conjunction with any light sensitive element.

The foregoing embodiments of the present invention have been presented for the purposes of illustration and description. These descriptions and embodiments are not intended to limit the invention to the precise form disclosed, and many modifications and variations are possible in light of the above disclosure. The embodiments were chosen and described in order to best explain the principle of the invention and its practical applications to thereby enable others skilled in the art to best utilize the invention in its various embodiments and with various modifications as are suited to the particular use contemplated.

Each feature disclosed or illustrated in the present specification may be incorporated in the invention, whether alone or in any appropriate combination with any other feature disclosed or illustrated herein.

The invention claimed is:

1. A light shield for shielding a light sensitive element in an image sensor comprising:
   a primary plate located such as to shield the light sensitive element from incident light, the primary plate comprising at least one aperture;
   at least one light blocking structure;
   wherein the light blocking structure comprises a secondary plate and a wall, wherein the wall comprises a continuous via structure surrounding the aperture, the wall being arranged between the primary plate and the secondary plate, and wherein the light blocking structure is configured to act as a light barrier to prevent light which has passed through the at least one aperture from propagating beyond the secondary plate.

2. A light shield as claimed in claim 1, wherein at least one of the primary and the secondary plates comprises metal.

3. A light shield as claimed in claim 1, wherein the wall extends from one of the primary plate and the secondary plate towards the other of the primary plate and the secondary plate.

4. A light shield as claimed in claim 1, wherein the wall is at least partially constructed using a via process.

5. A light shield as claimed in claim 1, wherein the wall comprises tungsten.

6. A light shield as claimed in claim 1, wherein the at least one light blocking structure is configured to block substantially all light passing through the at least one aperture.

7. A light shield as claimed in claim 1, further comprising a plurality of apertures, wherein the secondary plate forms part of the at least one light blocking structure for each of the plurality of apertures.

8. A light shield as claimed in claim 1, further comprising a plurality of apertures and a plurality of secondary plates, wherein each aperture is associated with a separate secondary plate.

9. A light sensitive element comprising a light shield as claimed in claim 1.

10. A light sensitive element as claimed in claim 9, further comprising a first plurality of light sensitive elements and a second plurality of light sensitive elements, the light shield being located and shaped such that it covers the first plurality of light sensitive elements, but not the second plurality of light sensitive elements, the image sensor being configured such that, in use, the second plurality of light sensitive elements detects incident light and the first plurality can be used to determine a dark current in the light sensitive elements.

11. An image sensor comprising a light sensitive element as claimed in claim 9.

12. An image sensor comprising a light sensitive element as claimed in claim 10.

13. An image sensor comprising a light shield as claimed in claim 1.

* * * * *